United States Patent [19]

Kerber et al.

[11] Patent Number: 5,003,475

[45] Date of Patent: Mar. 26, 1991

[54] MEDICAL IMAGING SYSTEM INCLUDING MEANS TO INCREASE DATA TRANSFER SPEEDS BY SIMULTANEOUSLY TRANSFERRING DATA FROM LATCHES TO REGISTERS AND FROM REGISTERS TO LATCHES

[75] Inventors: Michael M. Kerber, Cleveland; Chris J. Vrettos, Mentor; Carl J. Brunnett, Willoughby Hills; John Sidoti, Parma, all of Ohio

[73] Assignee: Picker International, Inc., Highland Hts., Ohio

[21] Appl. No.: 276,143

[22] Filed: Nov. 25, 1988

[51] Int. Cl.[5] ............................................. G06F 15/38
[52] U.S. Cl. ........................... 364/413.21; 365/189.02; 365/230.02; 365/230.05
[58] Field of Search ...................... 365/189.02–189.04, 365/230.02–230.03, 230.05; 364/413.22, 413.21, 413.19

[56] References Cited

U.S. PATENT DOCUMENTS

| | | | |
|---|---|---|---|
| 4,085,444 | 4/1978 | Schneider | 364/900 |
| 4,410,964 | 10/1983 | Nordling et al. | 365/230.05 |
| 4,554,645 | 11/1985 | Furman | 365/230.05 |
| 4,725,987 | 2/1988 | Cates | 365/189.04 |
| 4,811,296 | 3/1989 | Garde | 365/189.02 |
| 4,815,038 | 3/1989 | Scharrer et al. | 365/230.05 |
| 4,817,051 | 3/1989 | Chang | 365/230.05 |

Primary Examiner—Michael R. Fleming
Assistant Examiner—Gail O. Hayes
Attorney, Agent, or Firm—Fay, Sharpe, Beall, Fagan, Minnich & McKee

[57] ABSTRACT

A customized random access memory circuit is provided to allow the processing of extremely high amounts of data in an area of very small physical size. The chip contains a group of interconnected registers with a set of input ports and a set of output ports. The input ports have individual write enable signals to allow them to write to selected address locations. A switching circuit is provided to ensure that the proper data from the proper input port goes to the chosen address location. A first and second set of latches are provided where the first set of latches are connected to a multiplexor first and the second set of latches are connected to a second multiplexor. The chip also contains a cycle skipping chip to allow the data to maintain its position and not be transferred through at least one clock cycle. Selected data sets which are going to be outputted have the data internally swapped to prepare it for use in floating point operations.

19 Claims, 4 Drawing Sheets

MEDICAL IMAGING SYSTEM INCLUDING MEANS TO INCREASE DATA TRANSFER SPEEDS BY SIMULTANEOUSLY TRANSFERRING DATA FROM LATCHES TO REGISTERS AND FROM REGISTERS TO LATCHES

BACKGROUND OF THE INVENTION

The present invention relates to digital processing. The present invention finds particular application in tomographic image reconstruction and will be described with particular reference thereto. However, it is to be appreciated that the invention is also applicable to other types of image and data processing.

In the field of computerized tomographic scanners, the accurate reconstruction of images is of utmost importance. One of the major drawbacks in accurate image reconstruction has been the amount of time necessary to complete the image reconstructions for each scan of a multi-scan procedure. The longer the time necessary to complete the image and initiate the next scan of the procedure, the more likely procedure degrading occurrences, such as patient movement, become.

Improving the speed of data acquisition or once data has been acquired, increasing the speed at which it is manipulated increases the speed of reconstruction of the scanned image. Central to the reconstruction of an image is a convolution process which prepares the data for backprojection into image. The speed of the convolution process is a constraint on the speed of the total system. Faster convolution achieves faster image reconstruction allowing for more accurate scans and less scans which must be re-performed.

As part of this convolution processing, data is stored at memory locations until it is needed for necessary mathematical computations. In the past, the conventional random access memory structure was used. It normally had a single port structure such that only one memory location could be accessed during a single clock cycle. While others have proposed using a dual port random access memory, only two memory locations could be processed per clock cycle. Both access speeds were so slow that mathematical operators in the system functioned below their theoretical top speeds.

SUMMARY OF THE INVENTION

The general purpose of the invention is to implement a 32 word by 8 bit slice random access memory, which provides five input ports and four output ports. All nine ports are uniquely able to access the memory in the same clock cycle. Further, separate write enable signals for each of the input ports is provided as a means of implementing the above. The present invention is used along with other integrated circuits to implement an array processor in a pipeline structure. The present invention used in a pipeline structure, with its unique design, allows data to be read to the structure and the data to be outputted from the structure during the same clock cycle.

A first advantage of the present invention is that it allows multiple individual input ports to access multiple individual memory addresses and to output a plurality of individual output data sets on the same clock cycle.

Another advantage of the present invention is that movement of large amounts of data are moved at a high performance level.

Still further advantages of the present invention will be apparent to others upon reading and understanding the following detailed description.

BRIEF DESCRIPTION OF THE DRAWINGS

The present invention may take form in various parts and arrangements of parts or in various steps and arrangements of steps. The drawings are only for purposes of illustrating a preferred embodiment and are not to be construed as limiting the invention.

DETAILED DESCRIPTION OF THE PREFERRED EMBODIMENT

With reference to FIGURE a CT scanner gantry A includes an x-ray tube 10 which selectively projects a fan shaped beam of radiation across an image circle 12. The radiation impinges upon a radiation detection means such as an array of stationary detectors 14 which generate electronic data signals indicative of radiation absorptive or transmissive properties of a subject in the image circle. A rotating means 16 selectively causes relative rotational movement of the radiation beam around the scanned circle 12. A data acquisition means B acquires the data generated by the detectors to generate a plurality of data sets or views.

In the preferred embodiment, each data set includes a data element for each detector which is currently irradiated and sampled. The data acquisition means samples an irradiated detector subset a plurality of times before the next subset or fraction of detectors becomes irradiated. The acquired data subsets are delivered to a preprocessing means C in which each data subset is normalized and spectrum and other corrections or adjustments are made. An image reconstruction means reconstructs an image representation of the radiation absorptive properties of the subject in the scan circle from the fan beam data subsets. The image reconstruction means includes a convolving means D which convolves sets of the data with a convolution function. A backprojector E backprojects the convolved data sets into an image memory for display on a video monitor or display means F. The image which has been reconstructed and displayed on display means F is archived G on tape or disk to be saved for future use.

Figure 1:
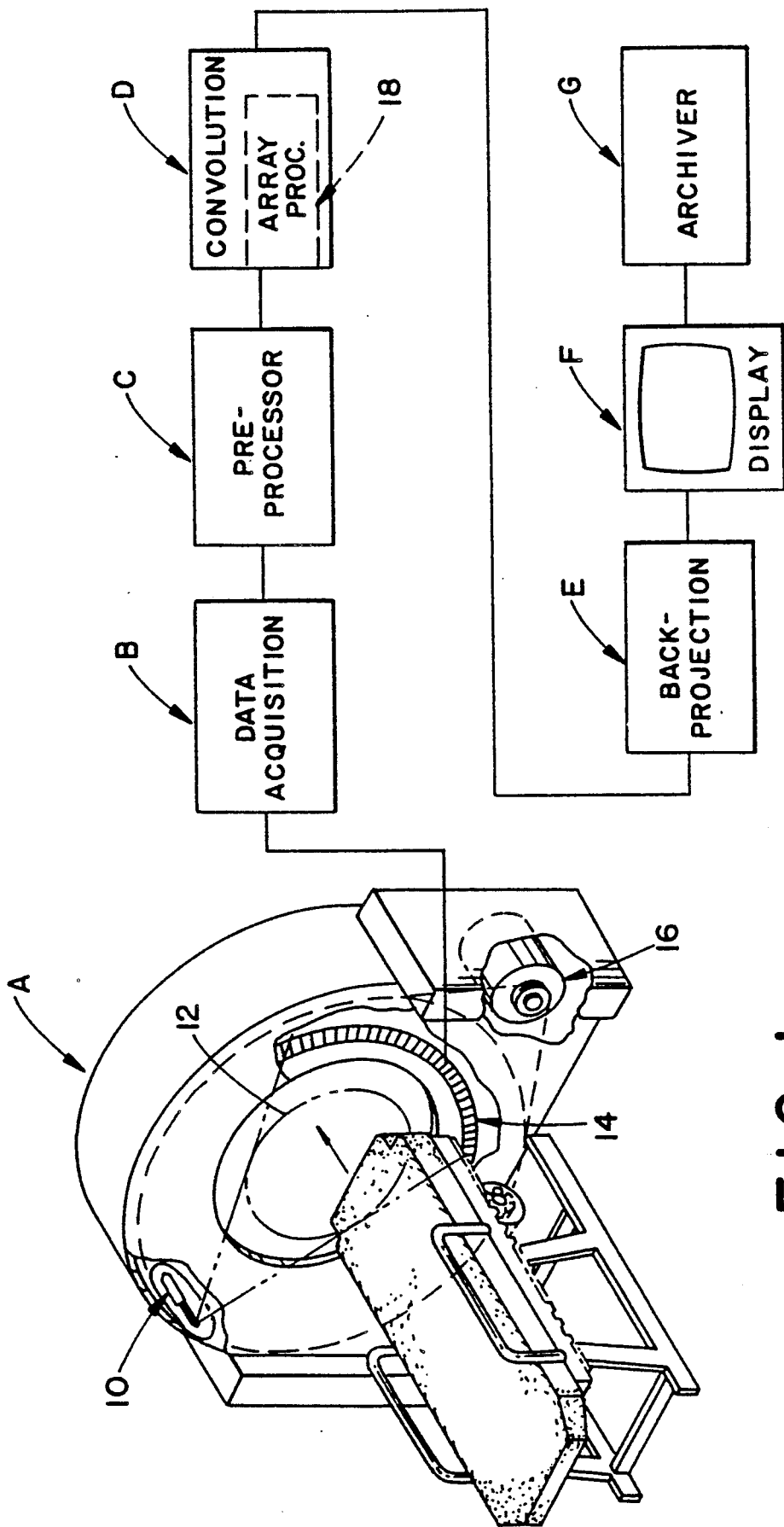
FIG. 1 is a diagrammatic illustration of a computed tomography imaging apparatus in accordance with the present invention.

With continuing reference to FIG. 1, the convolving means D includes an array processor means 18. The array processing means 18 manipulates data received from the preprocessing means B to order the data into subsets and process it into the proper form for the backprojecting means D.

Figure 2:
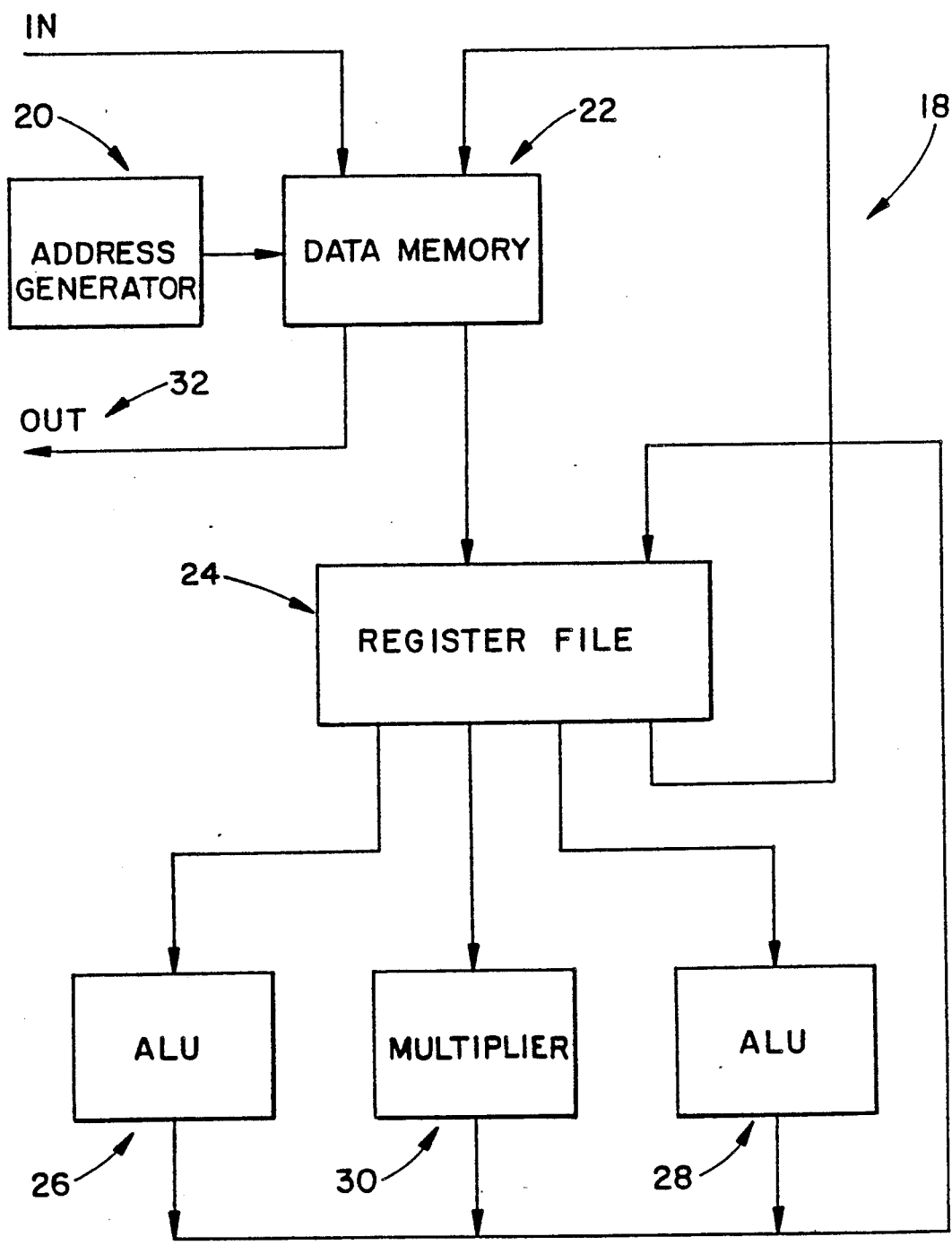
FIG. 2 is a simplified block diagrammatic illustration a system incorporating the present invention.

Turning now to FIG. 2 which shows a simplified block diagram of the array processor 18. An address generator 20 cyclically generates selected addresses for a data memory means 22. The data memory means 22 receives and passes data to a register file 24 under the control of the address generator. The register file 24 in turn passes on selected data to an arithmetic unit consisting of floating point adding units 26, 30 and floating point multiplying unit 28. It also recirculates a selected part of the data back to the data memory means 22. Each line of data received in the data memory 22 is repeatedly operated on with a convolution function which modifies each data element in accordance with neighboring and other data elements in the line. After the data line is convolved, the address generator passes it to output 32 and the next data line is received in the data memory.

Figure 3:
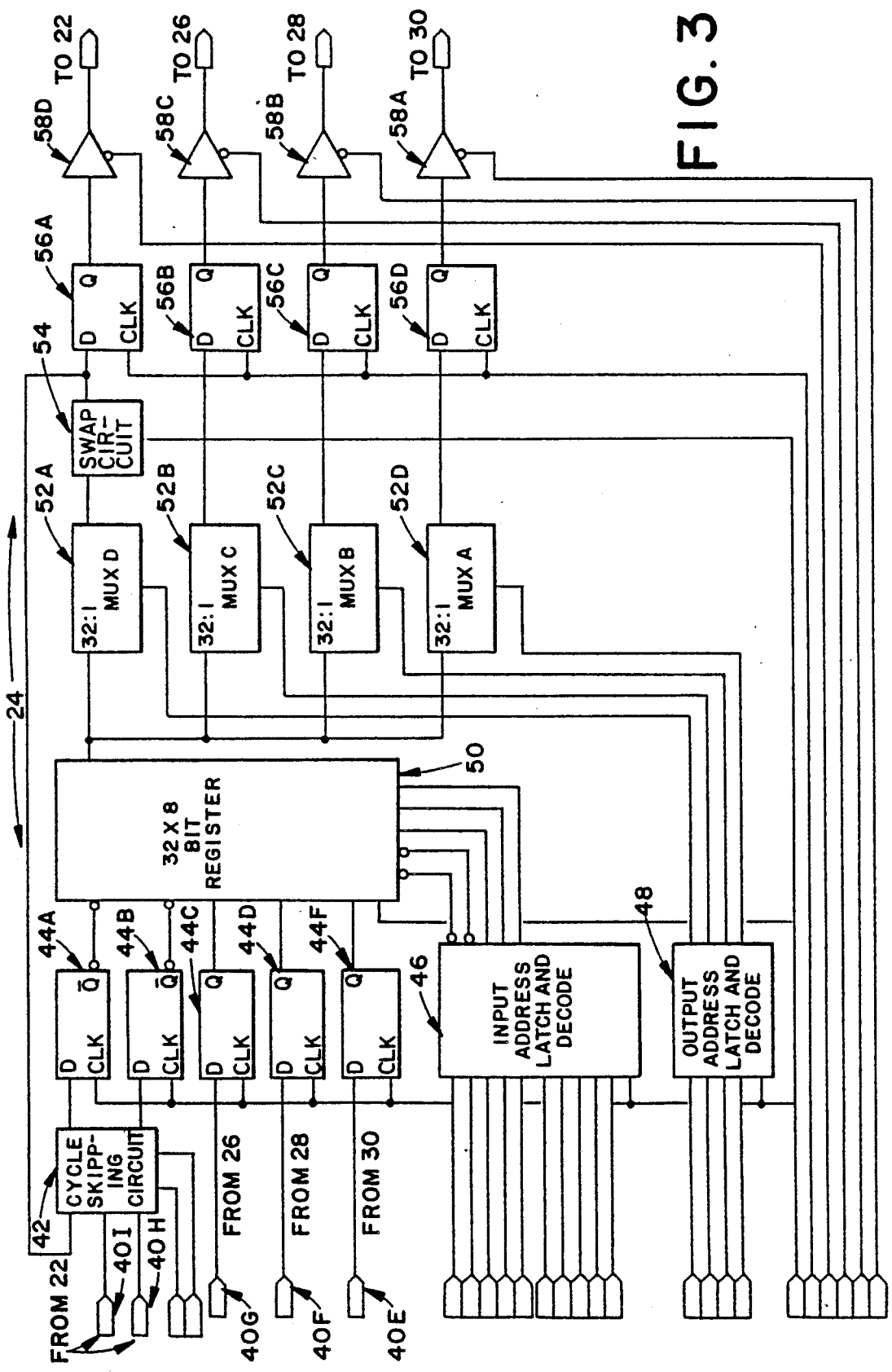
FIG. 3 is a block diagram of a custom integrated circuit of the present invention; and, FIG. 4 is a block diagram expanding in detail on the input to the register of the custom integrated circuit of FIG. 3.

With reference to FIG. 3, data is received in the register file from a plurality of output sources, preferably, five input sources: 40E-40I. In the preferred embodiment, two input ports 40H and 40I accept data from data memory 22. The other three input ports 40E-40G receive data from the floating adders 26 and 30 and the floating point multiplier 28.

Data is moved in a pipeline manner such that at least four data operations can be performed at a time. Specifically, at the leading edge of a first clock pulse, data received in a plurality of latches, specifically, in latches 44A-44E are clocked into chosen address locations of a 32×8 bit register 50. In the same first clock pulse, data from other chosen locations of the 32×8 bit register 50 is clocked out to a plurality of multiplexers, specifically to 32:1 multiplexers 52A-52D. Multiplexed data from multiplexers 52A-52D are clocked with the leading edge of the same clock pulse to a second plurality of latches, specifically, latches 56A-56D. The data at the outputs Q of the latches 56A-56D are available to outputs 58A-58D after a predetermined delay from the leading edge of the same clock pulse.

The address generator generates the addresses in a pattern in which the data is never read into and out of the same memory cell of the 32×8 bit register in the same clock cycle.

Cycle skipping circuit 42 is activated when additional data is received by the data memory 22. Specifically, when data is to be read externally by the data memory, data is saved at a data holding register which exists at the H input of the register file 50. This register saves the data present at the port during a cycle skip sequence. The data resulted from a read operation from data memory 22 during a cycle skip operation. The cycle skip operation stops the movement of data from continuing in its normal pipeline type manner immediately following the cycle skip operation and on the first clock cycle that data is clocked into the H input of the register file 50, thus preserving it.

The present embodiment has the additional capability of performing a register to register transfer of data from one of the 32 register locations to a different register location within the 32 register locations. Specifically, the D output port internally transfers data from its port into the I input port, thereby allowing the contents of a selected register location of the register file 50 to be transferred to a second selected register location without the necessity of recirculating the data externally through the data memory 22, the floating point adders 26, 28 or the floating point multiplier 30.

A swapping circuit 54 transforms the data to be used by the floating point adders 26 and 30 and the floating point multiplier 28. to allow the data used by the floating point adders and floating point multiplier to be used immediately, which thereby increases processing speeds by avoiding the necessity of such manipulation in the adder and multiplier units.

Figure 4:
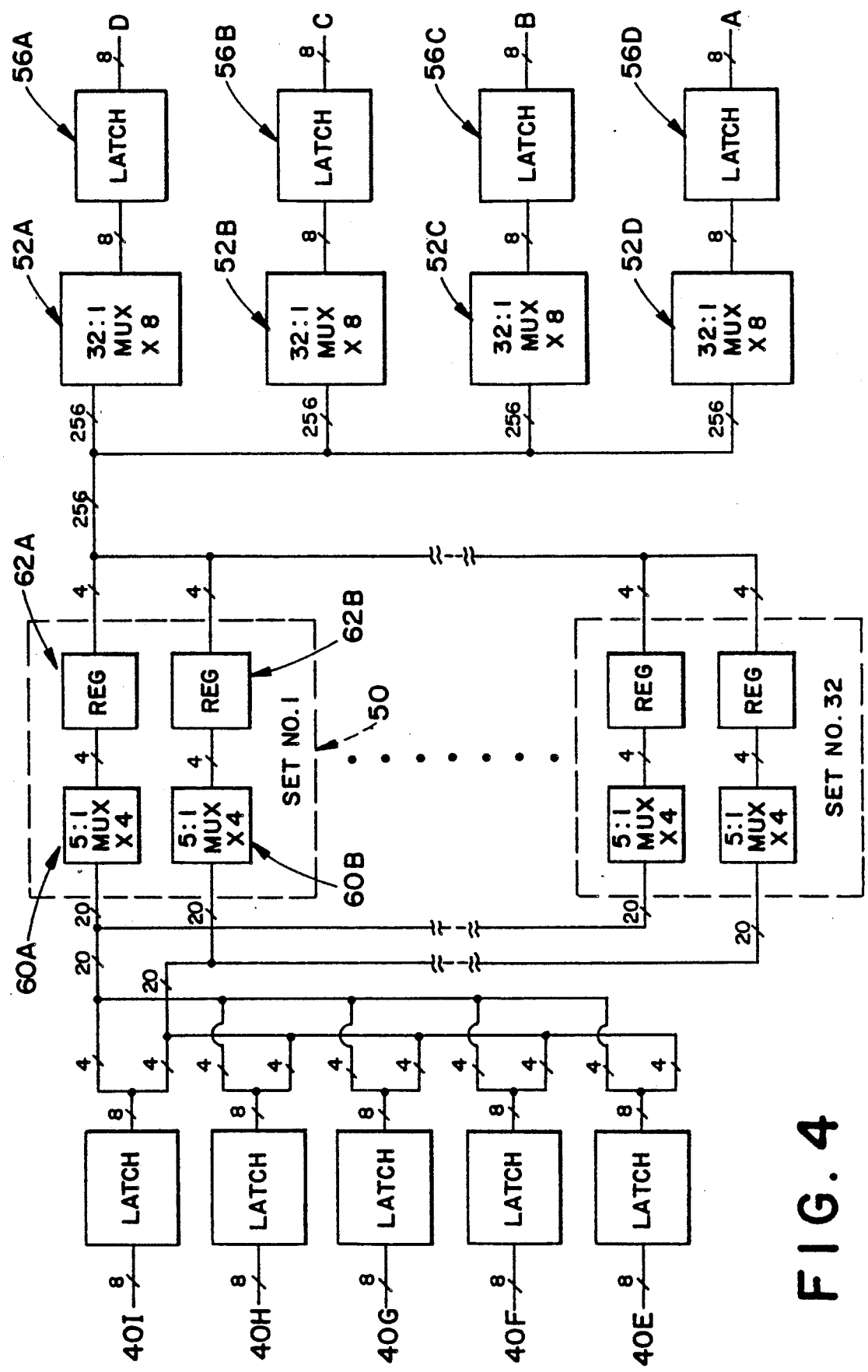

With reference to FIG. 4, the register 50 includes a plurality of smaller subregister means 62. In the 32×8 bit preferred embodiment, it can be divided into 32 1×8 bit subregister means 62. Of course, the depth of each register means 62 is selected in accordance with the size of the data to be received. If n bit data is to be received ster means 62 would be 1×n bits.

The 32×8 bit register 50 also includes a switching means for selectively interconnecting each subregister means 62 with one of the inputs 40E-40I. In the preferred embodiment, an 8 or n bit multiplexer means is connected with each subregister. In the illustrated five input embodiment, each multiplexer means is a 5:1 multiplexer. However, for m inputs, an m:1 multiplexer would be selected. In the preferred embodiment m is 5.

Each multiplexer means is connected with all of the inputs. For five inputs which receive 8 bit data, each multiplexer means 60 receives 40 inputs and has 8 outputs, one to each of the memory cells of its corresponding subregister. Each of the multiplexing means 60 is addressed to cause data from the corresponding one of the inputs to be channeled to its corresponding subregister 62.

For still greater speed, the data is processed in four bit packets. To this end, each multiplexing means 60 includes two four bit multiplexers 60A and 60B. Analogously, each of the 1×n subregisters is divided into n/4 four bit subregisters, i.e. two four bit subregisters in the illustrated 8 bit embodiment. Analogously, 16 bit data could be divided among two 8 bit multiplexers and two 8 bit subregisters or among four 4 bit multiplexers and four 4 bit subregisters.

Analogously, the four 32:1 eight bit multiplexers 52A-52B are controlled to read data only from selected ones of subregisters 62. Again, the multiplexing means 60 and the multiplexing means 52 are controlled in coordination such that the multiplexers 60 are never trying to write into the same subregister as multiplexers 52 are trying to read out of.

The preferred embodiment as used is a 32×8 bit slice random access memory. Five input ports and four output ports can uniquely access the memory 50 in the same clock cycle. Each of the five input ports have unique write enable signals.

The invention has been described with reference to the preferred embodiment. Obviously, modifications and alterations will occur to others upon reading and understanding the preceding detailed description of the preferred embodiment. It is intended that the invention be construed as including all such modifications and alterations insofar as they come within the scope of the appended claims or the equivalents thereof.

Having thus described the preferred embodiment, the invention is now claimed to be:

1. A computerized tomographic scanner comprising;
a source of radiation for irradiating an examination region;
a detector array for receiving radiation that has transversed the examination region and producing output signals indicative thereof;
a data acquisition means for receiving the detector output signals and producing n-bit digital data values;
an array processor for processing the n-bit digital values, the array processor including:
m input ports for receiving m n-bit digital values, where m is a plural integer;
p output ports, where p is a plural integer for outputting p of the n-bit data values concurrently;

q 1×n bit registers, where q is a plural integer greater than m and p a switching means for concurrently switching the m input ports with m of the q 1×n bit registers and a p different ones of the q 1×n bit registers with the p output ports, said switching means including means for entering a plurality of data values into the registers by the m input ports and means for concurrently reading a plurality of data values from the registers by the p output ports;

a backprojecting means of backprojecting processed data from the array processor into an image memory.

2. The scanner as set forth in claim 1 further including m first latches, each first latch being connected with one of the m input ports.

3. The scanner as set forth in claim 2 further including p second latches, each connected with one of the p output ports.

4. The scanner as set forth in claim 3 wherein the switching means includes q first multiplexing means, each of the q multiplexing means being connected with one of the q 1×n bit registers and with all m first latches; and, p second multiplexing means, each of the p second multiplexing means being connected with all q 1×n bit registers and with one of the p second latches.

5. The scanner as set forth in claim 4 further including a clocking means for concurrently clocking the first and second latches such that data is transferred from the first latches into the registers and from the registers to the second latches in a common clock cycle.

6. The scanner as set forth in claim ,4 further including an addressing means operatively connected with the first and second multiplexing means for controlling which m of the q registers receive data from the first latches and which p of the registers are read into the second latches.

7. The scanner as set forth in claim 4 wherein each of the 1×n bit register means includes two 1×n/2 bit subregisters and wherein each of the first multiplexing means includes two n/2 bit multiplexers.

8. An array processor for processing n-bit digital values, the processor comprising:

m input ports for receiving m n-bit digital values, where m is a plural integer;

p output ports, where p is a plural integer for outputting p of the n-bit data values concurrently;

q 1×n bit registers, where q is a plural integer greater than m and p;

a switching means for concurrently switching the m input ports with m of the q 1×n bit registers p different ones of the q 1×n bit registers with the p output ports, said switching means including means for entering a plurality of data values into the registers by the m input ports and means for concurrently reading a plurality of data values from the registers by the p output ports.

9. The processor as set forth in claim 8 further including m first latches, each first latch being connected with one of the m input ports.

10. The processor as set forth in claim 9 further including p second latches, each connected with one of the p output ports.

11. The processor as set forth in claim 10 wherein the switching means includes q first multiplexing means, each of the q multiplexing means being connected with one of the q 1×n bit registers and with all the m latches and, p second multiplexing means, each of the p second multiplexing means being connected with all q 1×n bit registers and with one of the p second latches.

12. The processor as set forth in claim 11 further including a clocking means for concurrently clocking the first and second latches such that data is transferred from the first latches into the registers and from the registers to the second latches in a common clock cycle.

13. The processor as set forth in claim 11 further including:

an addressing means operatively connected with the first and second multiplexing means for controlling which m of the q registers receive data from the first latches and which p of the registers are read into the second latches.

14. The processor as set forth in claim 11 wherein each of the 1×n bit register means includes two one by n/2 bit subregisters and wherein each of the first multiplexing means includes two n/2 bit multiplexers.

15. The processor as set forth in claim 8 wherein q is 32 and n is a multiple of 8.

16. The processor as set forth in claim 15 wherein m is five and p is four.

17. A method of processing data at high speeds, the method comprising:

receiving data values in a plurality of latches;

in a first clock cycle, transferring the data values simultaneously from the first plurality of latches into a first subset of a plurality of registers;

on the same first clock cycle, transferring data values from a second subset of registers to a second plurality of latches, the first and second register subsets being unique.

18. The method as set forth in claim 17 further including transferring data from the first latches to the register and from the register to the second latches in each of a plurality of clock cycles and in each clock cycle selecting the first and second register subsets.

19. The method as set forth in claim 18 wherein there are at least five first latches and at least four second latches and more than ten registers.

* * * * *